(12) United States Patent
Schlereth et al.

(10) Patent No.: US 9,741,616 B2
(45) Date of Patent: *Aug. 22, 2017

(54) METHOD FOR PRODUCING OPTOELECTRONIC SEMICONDUCTOR COMPONENTS, LEADFRAME ASSEMBLY AND OPTOELECTRONIC SEMICONDUCTOR COMPONENT

(71) Applicant: OSRAM Opto Semiconductors GmbH, Regensburg (DE)

(72) Inventors: Thomas Schlereth, Regensburg (DE); Michael Bestele, Lappersdorf (DE); Christian Gaertner, Regensburg (DE); Tobias Gebuhr, Regensburg (DE); Hans-Christoph Gallmeier, Regensburg (DE); Peter Holzer, Obertraubling (DE); Karlheinz Arndt, Bad Abbach (DE); Albert Schneider, Thalmassing (DE)

(73) Assignee: OSRAM OPTO SEMICONDUCTORS GMBH, Regensberg (DE)

( * ) Notice: Subject to any disclaimer, the term of this patent is extended or adjusted under 35 U.S.C. 154(b) by 225 days.

This patent is subject to a terminal disclaimer.

(21) Appl. No.: 14/405,393

(22) PCT Filed: May 3, 2013

(86) PCT No.: PCT/EP2013/059233
§ 371 (c)(1),
(2) Date: Dec. 3, 2014

(87) PCT Pub. No.: WO2013/182358
PCT Pub. Date: Dec. 12, 2013

(65) Prior Publication Data
US 2015/0200138 A1     Jul. 16, 2015

(30) Foreign Application Priority Data

Jun. 5, 2012    (DE) ..................... 10 2012 104 882

(51) Int. Cl.
*G01R 31/27*     (2006.01)
*H01L 21/78*     (2006.01)
(Continued)

(52) U.S. Cl.
CPC .............. *H01L 21/78* (2013.01); *H01L 21/50* (2013.01); *H01L 22/10* (2013.01);
(Continued)

(58) Field of Classification Search
CPC ......... H01L 21/50; H01L 21/78; H01L 22/10; H01L 23/49565; H01L 23/49541; H01L 33/62; G01R 31/2635
(Continued)

(56) References Cited

U.S. PATENT DOCUMENTS 7,173,321 B2    2/2007   Kim
8,168,989 B2 *   5/2012   Isobe ........................ F21K 9/90
                                              257/666

(Continued)

FOREIGN PATENT DOCUMENTS

DE    102011056700 A1    6/2013
DE    102011056706 A1    6/2013
(Continued)

OTHER PUBLICATIONS

Machine translation, Sakamoto, Japanese Patent Publication No. S58-192389, translatiion date: Sep. 1, 2016, Espacenet, all pages.*

*Primary Examiner* — Victoria K Hall
(74) *Attorney, Agent, or Firm* — McDermott Will & Emery LLP

(57) ABSTRACT

In one embodiment, the method is configured for producing optoelectronic semiconductor components (1) and includes the steps of:

(Continued)

Figure 1:
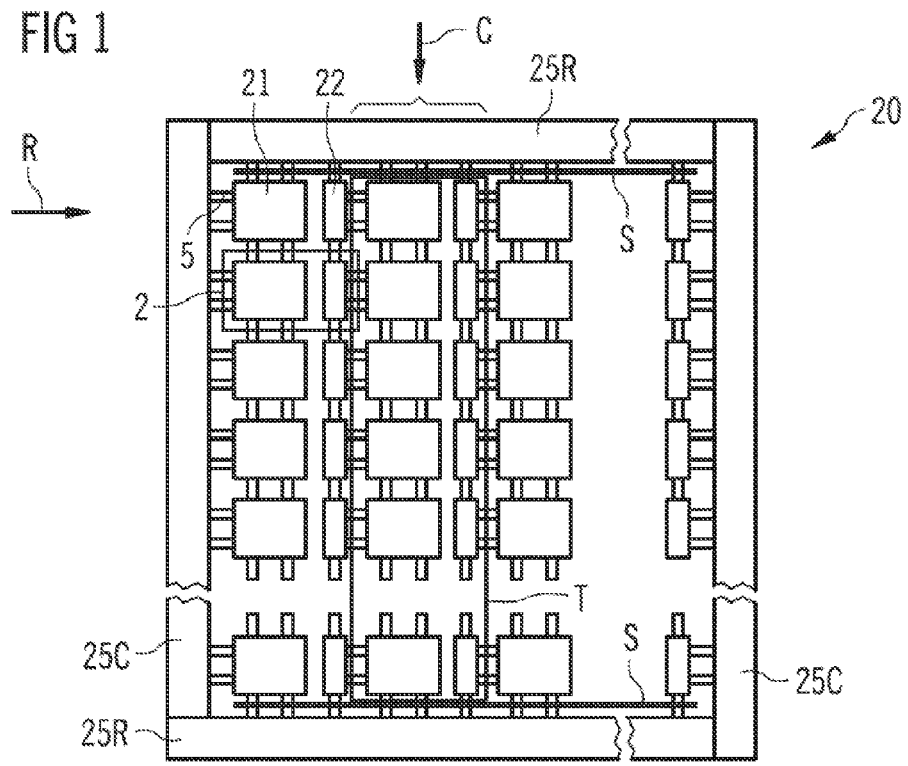

providing a leadframe assembly (20) with a multiplicity of leadframes (2), each having at least two leadframe parts (21, 22);

forming at least a part of the leadframe assembly (20) with a housing material for housing bodies (4);

dividing the leadframe assembly (20) between at least one part of the columns (C) and/or the rows (R), wherein the leadframes (2) remain arranged in a matrix-like manner;

equipping the leadframes (2) with at least one optoelectronic semiconductor chip (3);

testing at least one part of the leadframes (2) equipped with the semiconductor chips (3) and formed with the housing material after the step of dividing; and separating to form the semiconductor components (1) after the step of forming and after the step of testing.

5 Claims, 6 Drawing Sheets

(51) Int. Cl.
| | |
|---|---|
| *H01L 33/00* | (2010.01) |
| *H01L 33/62* | (2010.01) |
| *H01L 21/50* | (2006.01) |
| *H01L 21/66* | (2006.01) |
| *G01R 31/26* | (2014.01) |
| *H01L 33/48* | (2010.01) |
| *H01L 23/495* | (2006.01) |

(52) U.S. Cl.
CPC .... *H01L 23/49565* (2013.01); *H01L 33/0095* (2013.01); *H01L 33/62* (2013.01); *G01R 31/2635* (2013.01); *H01L 23/49541* (2013.01); *H01L 33/486* (2013.01); *H01L 2224/48091* (2013.01); *H01L 2224/48247* (2013.01); *H01L 2933/0033* (2013.01); *H01L 2933/0066* (2013.01)

(58) Field of Classification Search
USPC ............. 257/48, 666, 670, E21.521; 438/15
See application file for complete search history.

(56) References Cited

U.S. PATENT DOCUMENTS

| | | | | |
|---|---|---|---|---|
| 9,219,210 | B2* | 12/2015 | Zitzlsperger | ............ H01L 24/97 |
| 9,231,179 | B2* | 1/2016 | Zitzlsperger | ............ H01L 22/32 |
| 9,425,372 | B2* | 8/2016 | Kanno | .................. H01L 33/647 |
| 9,461,220 | B2* | 10/2016 | Ikenaga | ................ H01L 33/486 |
| 2003/0006492 | A1* | 1/2003 | Ogasawara | ........... H01L 21/561 |
| | | | | 257/684 |
| 2004/0157372 | A1 | 8/2004 | Manatad | |
| 2005/0087846 | A1* | 4/2005 | Han | .................... H01L 21/4842 |
| | | | | 257/666 |
| 2008/0224161 | A1* | 9/2008 | Takada | .................. H01L 33/486 |
| | | | | 257/98 |
| 2008/0253064 | A1* | 10/2008 | Wu | ........................ H01L 33/62 |
| | | | | 361/829 |
| 2008/0265248 | A1 | 10/2008 | Drwinga et al. | |
| 2010/0013504 | A1* | 1/2010 | Wedlake | ............ G01R 1/07385 |
| | | | | 324/755.01 |
| 2011/0116271 | A1 | 5/2011 | Ide et al. | |
| 2011/0241039 | A1 | 10/2011 | Liao | |
| 2012/0025361 | A1 | 2/2012 | Ito et al. | |
| 2012/0132949 | A1 | 5/2012 | Watari et al. | |
| 2012/0324204 | A1* | 12/2012 | Inoue | ..................... G11C 15/00 |
| | | | | 711/200 |
| 2014/0299911 | A1* | 10/2014 | Zitzlsperger | ............ H01L 23/60 |
| | | | | 257/99 |
| 2014/0353710 | A1* | 12/2014 | Zitzlsperger | ............ H01L 24/97 |
| | | | | 257/99 |
| 2015/0076549 | A1* | 3/2015 | Gebuhr | ................. H01L 33/005 |
| | | | | 257/99 |

FOREIGN PATENT DOCUMENTS

| | | | |
|---|---|---|---|
| DE | 102011056708 A1 | 6/2013 | |
| JP | S58-192389 | * 11/1983 | ............ H01L 33/00 |
| JP | S58192389 A | 11/1983 | |
| JP | 2008227166 A | 9/2008 | |
| JP | 2011100780 A | 5/2011 | |
| JP | 2011129876 A | 6/2011 | |
| JP | 2012023281 A | 2/2012 | |
| JP | 2012028686 A | 2/2012 | |
| JP | 2012028699 A | 2/2012 | |

* cited by examiner

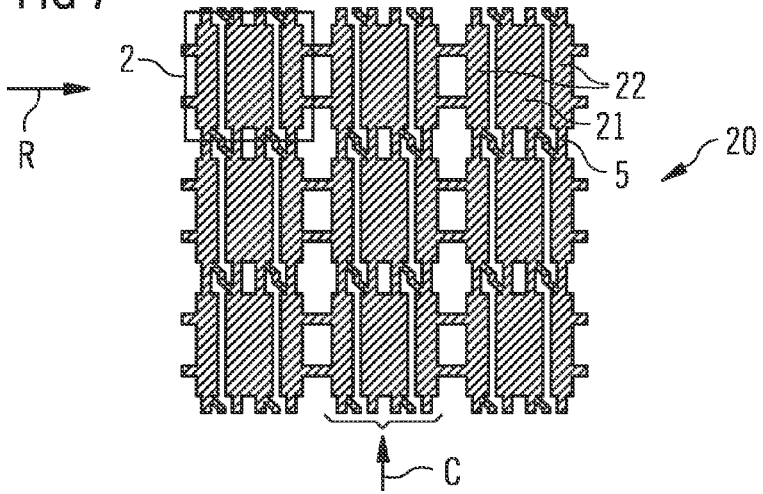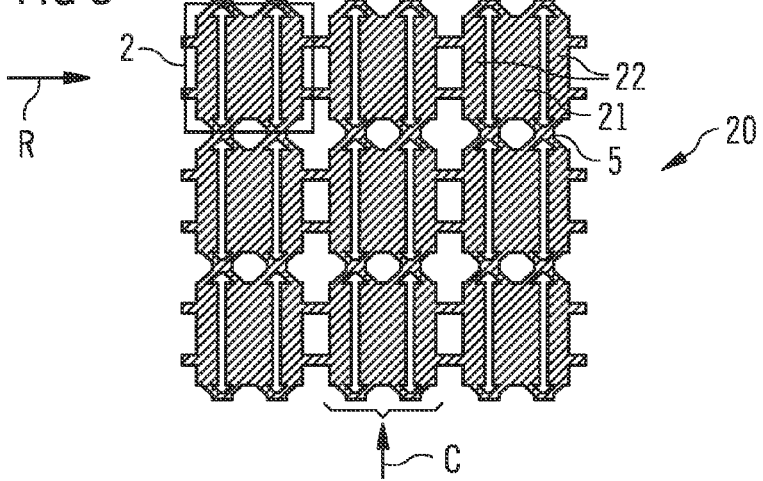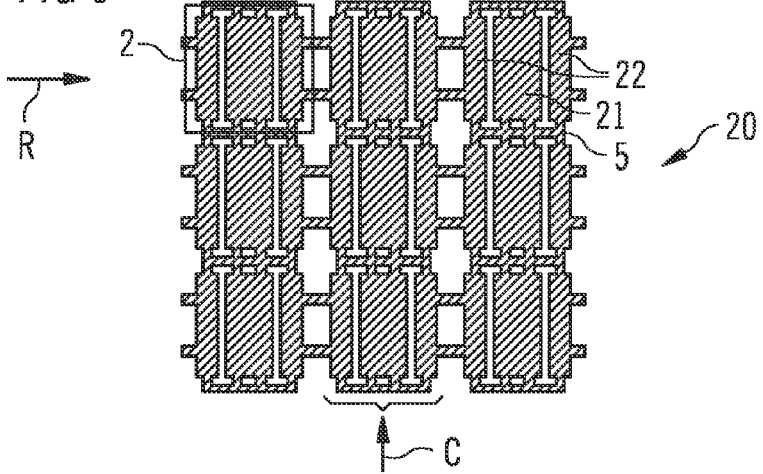

FIG 10
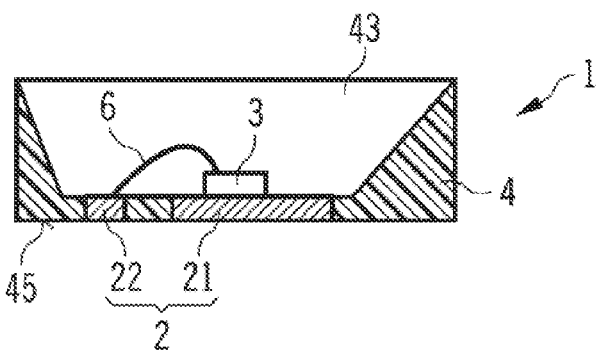
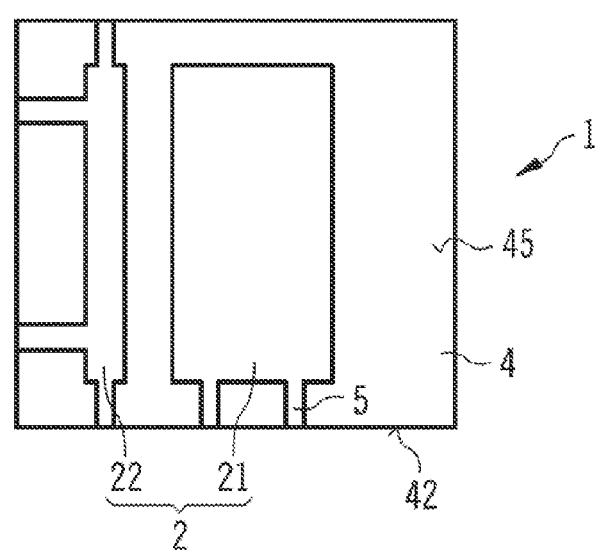
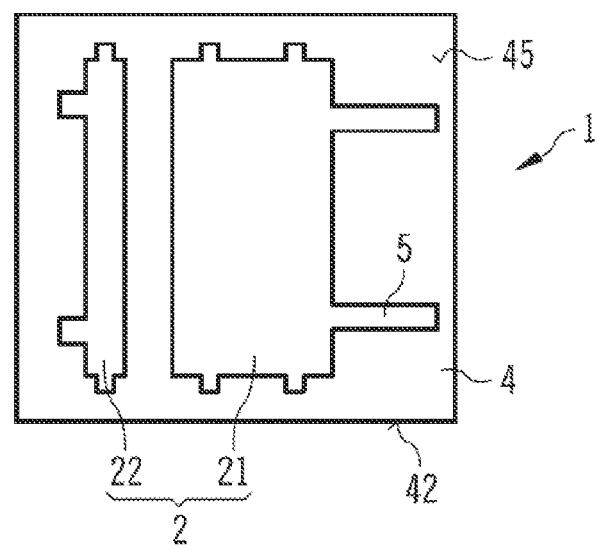

METHOD FOR PRODUCING OPTOELECTRONIC SEMICONDUCTOR COMPONENTS, LEADFRAME ASSEMBLY AND OPTOELECTRONIC SEMICONDUCTOR COMPONENT

A method for producing optoelectronic semiconductor components is provided. Furthermore, a leadframe assembly for such a method is provided. Moreover, an optoelectronic semiconductor component produced by means of the method is provided.

An object to be achieved is that of providing an efficient and cost-effective method for producing optoelectronic semiconductor components.

This object is achieved inter alia by a method having the features of the independent claim. Preferred developments are described in the dependent claims.

In accordance with at least one embodiment, the method is used to produce optoelectronic semiconductor components. The semiconductor component is, for example, light-emitting diodes, LEDs for short, laser diodes or photodiodes.

In accordance with at least one embodiment, the method includes the step of providing a leadframe assembly. The leadframe assembly is, for example, a cohesive piece which includes an electrically conductive material or consists of an electrically conductive material. For example, the leadframe assembly is formed from a copper sheet.

In accordance with at least one embodiment, the leadframe assembly includes a multiplicity of leadframes. The individual leadframes are preferably arranged in rows and columns in a regular matrix. An array grid of the leadframes is preferably formed to be rectangular. Each of the leadframes is provided for one of the semiconductor components to be produced.

In accordance with at least one embodiment, each of the leadframes includes two, or more than two, leadframe parts. At least two leadframe parts follow one another along the rows of the leadframe assembly. In other words, the rows are defined by the position of the leadframe parts. It is possible that the respective leadframes only have precisely one leadframe part along the columns.

In accordance with at least one embodiment, the method includes the step of forming at least a part of the leadframe assembly with a housing material. The housing material is provided for housing bodies of the semiconductor components to be produced. By means of the housing material, the leadframe assembly is preferably mechanically stabilised in the hardened state. By means of the forming with the housing material, it is possible to remove individual partial regions of the leadframe assembly, in particular between adjacent leadframes, without adversely affecting the mechanical integrity of the unit consisting of the leadframe assembly and the housing material.

In accordance with at least one embodiment, the method includes the step of equipping the leadframes. The leadframes are equipped in particular with one or more optoelectronic semiconductor chips. The at least one semiconductor chip is, for example, a light-emitting diode chip which is configured to produce electromagnetic radiation during operation of the semiconductor component. Furthermore, it is possible that the leadframe is equipped with protective diodes to prevent damage caused by electrostatic discharges and/or with further components such as sensors for temperature or radiation.

In accordance with at least one embodiment, the method includes the step of dividing the leadframe assembly. "Dividing" means that partial regions of the leadframe assembly are removed for example by means of sawing, punching, boring or laser-cutting. In particular, dividing refers to connecting webs between adjacent leadframes. During dividing the leadframe assembly, it is possible that a part of the housing material is also removed. However, the mechanical integrity of a possibly already attached housing material is not adversely affected, or is not significantly adversely affected, by dividing the leadframe assembly.

In accordance with at least one embodiment, the leadframe assembly is divided along at least one part of the columns and/or rows and between adjacent columns and/or rows. Likewise, dividing can take place between columns and/or rows on the one hand and edge strips of the leadframe assembly on the other hand. Preferably, dividing takes place along the entire rows and/or columns and not only in relation to one part of the corresponding columns and/or rows. In particular, the extent of division is from one edge strip to an opposite edge strip.

In accordance with at least one embodiment, the leadframe assembly is preserved, in terms of the arrangement of the individual leadframes, during dividing. In other words, it is possible that a relative position of the leadframes with respect to each other is not changed during the step of dividing. The leadframes remain arranged in particular in a matrix-like manner in the rows and columns during the step of dividing.

In accordance with at least one embodiment, the method includes the step of testing at least one part or all of the leadframes equipped with the semiconductor components and formed with the housing material. Alternatively, it is possible that testing occurs prior to the forming with the housing material. The step of testing is performed after the step of dividing the leadframe assembly. "Testing" means in particular that the semiconductor chips are checked for their electrical connection and/or their operational reliability. For example, the semiconductor chips are temporarily operated electrically.

In accordance with at least one embodiment, the method includes the step of separating to form the semiconductor components. For example, separating is effected by sawing along the rows and columns and between adjacent rows and columns. This step of separating is performed after the step of forming with the housing material and after the step of testing the semiconductor components.

According to at least one embodiment, the method is configured for producing optoelectronic semiconductor components and includes at least the following steps in the stated sequence or in a different sequence:
  providing a leadframe assembly having a multiplicity of leadframes arranged in rows and columns, wherein the leadframes each include at least two leadframe parts following one another along the rows and the leadframes are each provided for one of the semiconductor components,
  forming at least one part of the leadframe assembly with a housing material for housing bodies of the semiconductor components,
  dividing the leadframe assembly along and between at least one part of the columns and/or rows, wherein the leadframes remain arranged in a matrix-like manner,
  equipping the leadframes with at least one optoelectronic semiconductor chip,
  testing at least one part of the leadframes equipped with the semiconductor chips and formed with the housing material, after the step of dividing, and separating to form the semiconductor components, after the step of forming and after the step of testing.

By means of such a method, it is possible to test the individual, equipped leadframes in terms of their function at a comparatively early stage of the production process. Therefore, defective or flawed leadframe assemblies and semiconductor components can be separated out, or repairs can still be made, at an early stage. Costs which can accrue as a result of faulty semiconductor components in subsequent method steps can hereby be reduced and the method is particularly cost-effective.

In accordance with at least one embodiment of the method, the leadframe assembly includes at least one edge strip. This edge strip is oriented in parallel with the rows. The edge strip is, for example, a continuous web. The edge strip is configured in particular for mechanically stabilising the leadframe assembly.

In addition to the edge strip oriented in parallel with the rows, further edge strips oriented perpendicularly thereto can also be provided. Preferably, four of the edge strips surround, in a frame-like manner, a partial region of the leadframe assembly having a multiplicity of leadframes. Where "leadframe assembly" is mentioned hereinafter, this can refer to the entire leadframe assembly or even the partial region which is formed by four such edge strips as a frame and the leadframes enclosed by this frame.

In accordance with at least one embodiment, the leadframe comprises a marginal row. The marginal row is the row located closest to the edge strip oriented in parallel therewith. In this marginal row, first leadframe parts are insulated from the first leadframe parts of the adjacent row in the leadframe assembly which is not yet divided. "Insulated" or "electrically insulated" or "electrically separated" means in this regard in the context of the present invention that there is no direct electrical connection between these adjacent first leadframe parts, for instance by a connecting web. However, it is possible that there is an indirect electrical connection via one or more of the edge strips. The term "insulated" or "electrically insulated" or "electrically separated" can thus functionally refer to connections only between the individual leadframes, in particular disregarding at least one or all the edge strips.

In accordance with at least one embodiment, the first leadframe parts in the marginal row in the leadframe assembly which is not yet divided are electrically connected to the edge strip, in particular via at least one connecting web.

The first leadframe parts are, in particular, those leadframe parts which are provided to be equipped with the semiconductor chips. The first leadframe parts can be the largest leadframe parts of the respective leadframes.

In accordance with at least one embodiment of the method, during dividing, the leadframe assembly is divided, particularly continuously divided, between the marginal row and the edge strip oriented in parallel therewith. By means of this division, it is possible that the first leadframe parts are electrically insulated from adjacent leadframe parts in the leadframe assembly.

In accordance with at least one embodiment, division is effected between two marginal rows and two adjacent edge strips, extending in parallel therewith, within a frame formed by the edge strips or within the leadframe assembly. These marginal rows preferably include at least 10% or at least 15% or at least 20% of the leadframes. Alternatively or in addition, these marginal rows include at the most 50% or at the most 40% or at the most 30% of the leadframes. The leadframes arranged in the marginal rows can preferably be tested in a mutually independent manner after the step of dividing.

In accordance with at least one embodiment, the adjacent leadframes are electrically connected together along at least a partial amount of the rows before the step of separating. The individual leadframe parts within a lead frame are, as seen along the rows, preferably not directly electrically connected together and/or not directly contacted via connecting webs.

In accordance with at least one embodiment, during dividing at least one part of this partial amount of the rows mentioned in the preceding paragraph is separated in each case from the adjacent rows and from a possibly adjacent edge strip. The step of dividing can further include electrically separating these rows also from edge strips extending perpendicularly with respect to the rows.

In accordance with at least one embodiment, the step of testing the equipped leadframes provided with the semiconductor chips is performed along the rows individually or electrically connected in series. For example, each of the equipped rows forms an electric series connection in which a multiplicity of the semiconductor chips can be operated via two electric contacts, one of which preferably being located at the end and the other at the start of the row.

In accordance with at least one embodiment, the leadframe parts are electrically connected together along the columns in the leadframe assembly which is not yet divided. Therefore, an electrically continuous connection along the columns, in particular a continuous electric connection between two opposite edge strips, can be provided between all the leadframe parts of the individual leadframes.

In accordance with at least one embodiment, dividing is effected between the marginal rows and the edge strips. The in particular equipped leadframes are hereby each electrically connected in parallel along the columns.

In accordance with at least one embodiment, the leadframe assembly is applied on an intermediate carrier. The intermediate carrier is, for example, a so-called thermo-release film. Said leadframe assembly is then applied on the intermediate carrier preferably prior to the step of dividing. Furthermore, the step of dividing then preferably takes place prior to the step of forming with the housing material.

In accordance with at least one embodiment, dividing is effected both along adjacent columns and also along adjacent rows. Adjacent leadframes are hereby electrically insulated from one another after the step of dividing. The leadframes are then preferably also electrically insulated from the edge strips.

In accordance with at least one embodiment, during the step of testing only one part of the equipped leadframes and the semiconductor chips mounted thereon is tested. A statistical evaluation takes place on the basis of the testing of this part of the leadframes and semiconductor chips. This evaluation and the test result are used to make a decision regarding further processing of the leadframe assembly. If the leadframe assembly has a particular number or a particular proportion of defective leadframes and/or semiconductor chips, then the leadframe assembly, including the components mounted thereon, is discarded or is subjected to modification work in order to dispense with continuing method steps and to save costs.

Furthermore, a leadframe assembly is provided. The leadframe assembly is configured for a method according to at least one of the above-mentioned embodiments. Features of the leadframe assembly are thus also disclosed for the method described herein and vice-versa.

In accordance with at least one embodiment, the leadframe assembly includes a multiplicity of connecting webs. Adjacent leadframes are mechanically and electrically directly connected to each other via the connecting webs. There is preferably no direct connection between the leadframe parts within a leadframe through connecting webs.

In accordance with at least one embodiment of the leadframe, the connecting webs between the marginal rows and the associated adjacent row are formed differently from the connecting webs between two adjacent rows, none of which adjoining the marginal row. In other words, it is possible that the leadframe assembly comprises at least two differently formed regions between two adjacent rows. The connecting webs between the marginal row and the adjacent edge strip oriented in parallel therewith can be formed like the connecting webs between adjacent rows not adjoining the marginal row.

Furthermore, an optoelectronic semiconductor component is provided. The semiconductor component is produced by means of a method as described in conjunction with one or more of the above-mentioned embodiments. Features of the semiconductor component are thus also disclosed for the method and the leadframe assembly and vice-versa.

In at least one embodiment, the optoelectronic semiconductor component includes a leadframe having at least two leadframe parts. At least one optoelectronic semiconductor chip is mounted on the leadframe. The semiconductor chip is located in a recess of a housing body. The leadframe parts are mechanically connected together via the housing body. The housing body is preferably the component which mechanically bears the semiconductor component.

In accordance with at least one embodiment, the semiconductor component is a so-called QFN component. QFN stands for Quad-Flat No-Leads.

In accordance with at least one embodiment, the leadframe parts follow each other in a longitudinal direction. In a direction perpendicular to the longitudinal direction, at least one of the leadframe parts is exposed at at the most one lateral boundary surface of the housing body. It is likewise possible that one or more of the leadframe parts are exposed at the most one lateral boundary surface, either in parallel with or transverse to the longitudinal direction.

A method described herein and a leadframe assembly described herein and an optoelectronic semiconductor component described herein will be explained in more detail hereinafter with reference to the drawing and using exemplified embodiments. Like reference numerals designate like elements in the individual figures. However, the references are not drawn to scale, rather individual elements can be illustrated excessively large for ease of understanding.

In the drawings:

FIGS. 1 to 5 show schematic illustrations of exemplified embodiments of methods described herein, FIGS. 6 to 9 show schematic illustrations of exemplified embodiments of leadframe assemblies described herein for methods described herein, and FIG. 10 shows a schematic illustration of an optoelectronic semiconductor component described herein.

FIG. 1 illustrates a schematic plan view of an exemplified embodiment of a leadframe assembly 20. A method for producing optoelectronic semiconductor components 1 will also be explained with the aid of this leadframe assembly 20.

The leadframe assembly 20 includes a multiplicity of leadframes 2. One of the leadframes 2 is designated in FIG. 1 by a rectangle. Each of the leadframes 2 contains a first leadframe part 21 and a second leadframe part 22. The leadframes 2 are arranged in a matrix-like manner along rows R and columns C in a regular pattern. The leadframe parts 21, 22 follow each other along the rows R. Each of the leadframes 2 has only precisely one of the leadframe parts 21, 22 along the columns C.

Adjacent leadframes 2 are connected to each other via connecting webs 5. Within a leadframe 2, the leadframe parts 21, 22 are not directly mechanically and electrically connected together via the connecting webs 5. The connecting webs 5 between adjacent leadframes 2 along the rows R are optional.

Furthermore, the leadframe assembly 20 contains edge strips 25R, 25C. The edge strips 25C, 25R enclose the leadframes 2 in a frame-like manner. The edge strips 25R, 25C are continuously electrically connected together. In contrast to the illustration, the leadframe assembly 20 can comprise several such frames formed from the edge strips 25C, 25R. Method steps and features which are described for such a frame can relate hereinafter to precisely one such frame or even to the entire leadframe assembly having a multiplicity of such frames.

The leadframe assembly 20 is formed for example from a copper sheet and has a thickness in particular between 90 μm and 300 μm inclusive. For example, the leadframe assembly 20 includes between 250 and 2500 leadframes 2 inclusive. In particular, the leadframe assembly 20 includes between 300 and 1200 leadframes 2 inclusive. Furthermore, the leadframe assembly can include, for example, at least four or at least nine or at least twelve frames formed by the edge strips 25C, 25R. The same is also true for all the other exemplified embodiments.

The semiconductor chips which are to be mounted on the leadframes 2 but are not shown in FIG. 1 are preferably mounted on the larger, first leadframe parts 21. A connection to the second leadframe parts 22 is made, for example, via a bond wire which is also not shown. Prior to being equipped with the semiconductor chips, the leadframe assembly 20 is extrusion-coated in places with a housing material for housing bodies, not shown. After this extrusion-coating, the leadframe assembly 20 is mechanically stabilised.

Prior to testing the semiconductor chips, not shown, the leadframe assembly 20 is partially divided. As shown in FIG. 1, dividing is effected along two separation lines S between marginal rows R and the edge strips 25R extending in parallel therewith. The leadframe parts 2 are hereby combined along a column C to form a test unit T in each case. All the leadframes 2 in the test unit T are electrically connected in parallel.

The individual columns C can be tested electrically one after the other or several columns C, spaced apart from each other by at least one of the columns, can be tested simultaneously. In this manner, all the semiconductor chips and the leadframes 2 or only a part thereof can be tested efficiently.

The equipped leadframes 2 are tested for example by needle contacts from a lower side of the component. Likewise, separate test points can be provided in each case between the rows R and columns C and the edge strips 25R, 25C. Test contacts which are accessible from the side to be equipped with the semiconductor chips are also possible.

If one of the columns C in the test unit T contains a defective semiconductor chip or a defective electric connection, then the semiconductor chip configured for example as a light-emitting diode will not illuminate. Non-functioning components can thus be determined individually.

As is also the case in all the other exemplified embodiments, dividing is effected such that mechanical stability of the already formed housing bodies is not adversely affected by providing separation lines S. Even after dividing, the leadframe assembly 20 can thus be handled as a whole for further method steps.

In particular, the method steps of forming with the housing material, testing and separating are each not specifically illustrated in the figures.

Figure 2:
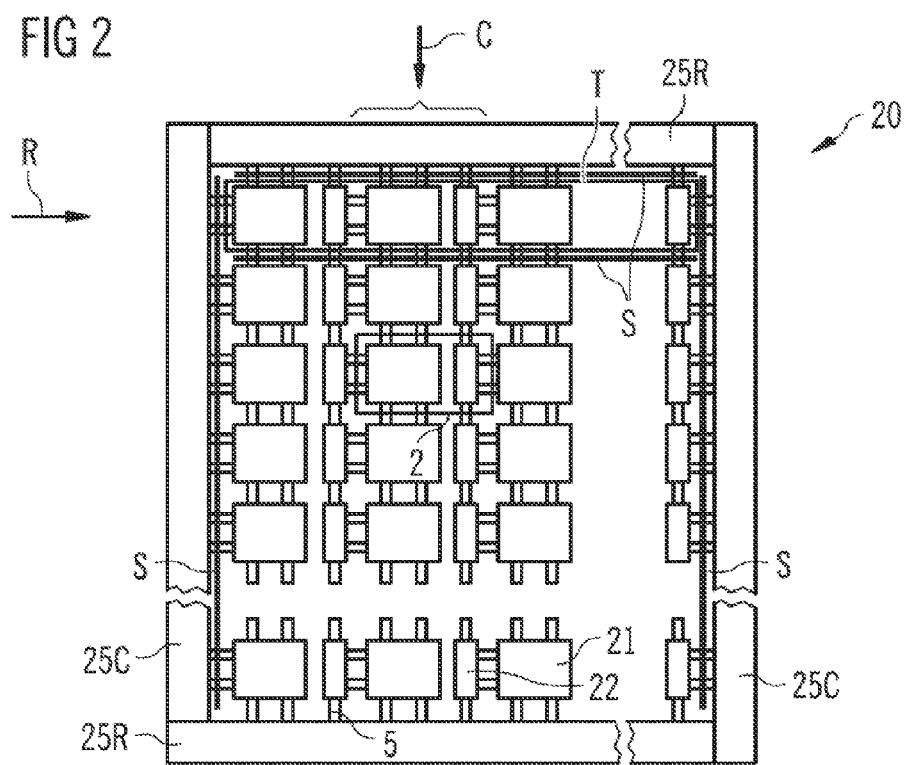

FIG. 2 illustrates a further exemplified embodiment of the method using the leadframe assembly 20. The leadframe assembly 20, which is not yet divided, can be formed as described in conjunction with FIG. 1.

When dividing the leadframe assembly 20, separation lines S are provided on both sides of the marginal rows R. Furthermore, separation lines S are provided along the edge strips 25C. The row R closest to the edge strip 25R which is the upper edge strip in FIG. 2 is hereby completely electrically separated from the edge strips 25C, 25R and from the further rows R. The leadframes and the semiconductor chips, not shown, of this marginal row R can be measured individually. In contrast to the illustration, it is likewise possible that two further separation lines S are located on both sides of the marginal row which is the lowermost row in FIG. 2.

Dividing is effected, for example, by sawing. It is likewise possible that the connecting webs 5 are divided by boring, laser-cutting or punching and separation is effected in this manner. Furthermore, dividing is performed after forming with the housing material is effected. Therefore, all the leadframes 2 are thus mechanically connected together via the housing material.

Figure 3:
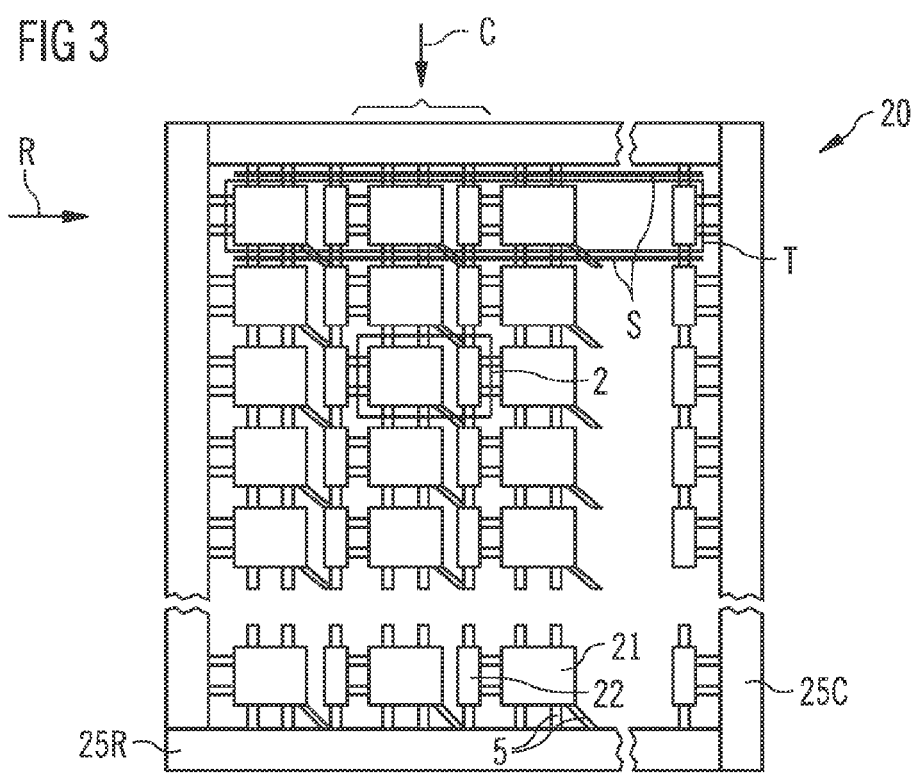

In the case of the method as shown in FIG. 3, the leadframe assembly 20 comprises n rows R. A separation line S is provided in each case between adjacent rows R and between the adjoining edge strips 25R. To simplify the illustration, only two of the separation lines S are shown in FIG. 3. Therefore, for n rows R, n+1 separation lines S are required in order to be able to subject all the leadframes 2 and semiconductor chips, not shown, to individual component measurement. For the individual component measurement, for example the two leadframe parts 21, 22 of a leadframe 2 or alternatively identically formed leadframe parts 21, 22 of two leadframes 2 which are adjacent along the rows R are contacted.

Optionally, it is possible, as is the case in all the other exemplified embodiments, that connecting webs 5 are provided which are arranged diagonally and are thus arranged to overlap the columns and overlap the rows. Mechanical stability of the leadframe assembly 20 can hereby be increased prior to the step of dividing.

Figure 4:
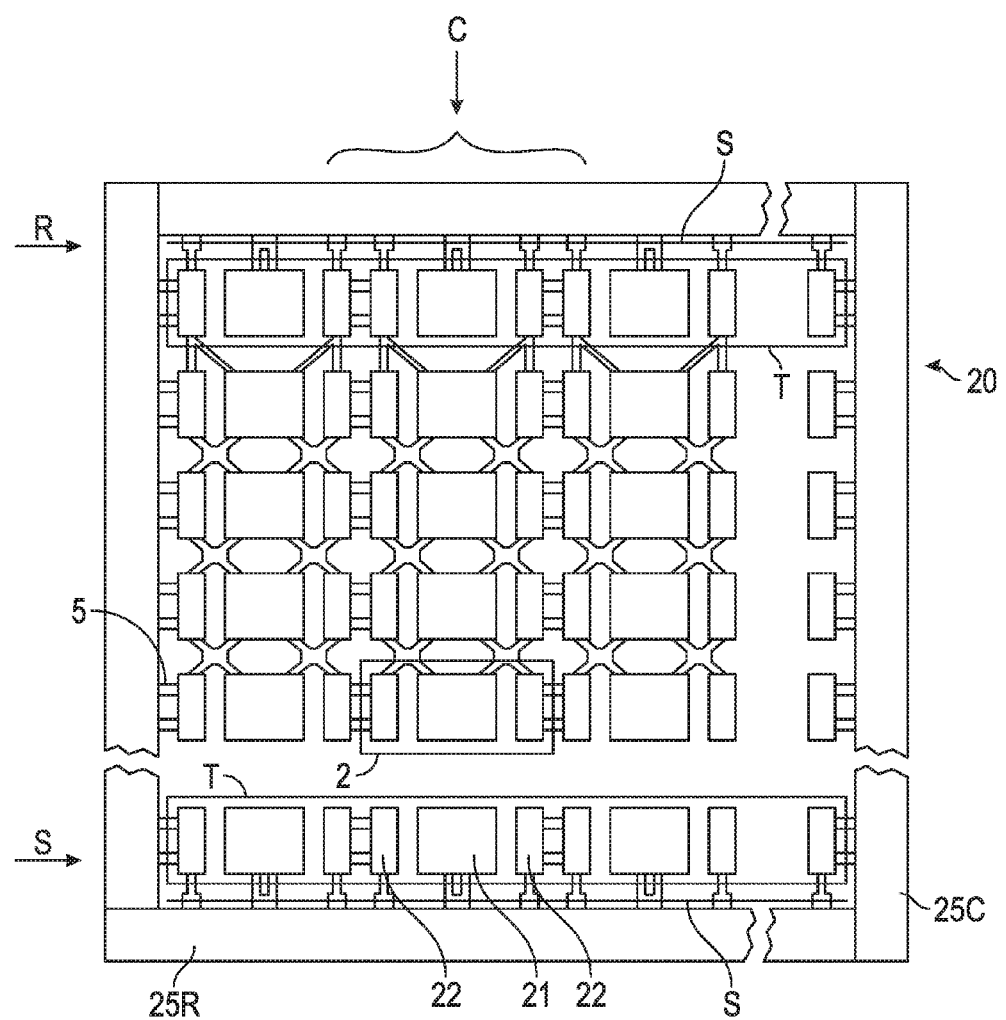

In the case of the exemplified embodiment described in FIG. 4, the connecting webs 5 between the two marginal rows R and the row R adjacent thereto in each case are formed differently from the connecting webs 5 between the remaining rows R and are also formed differently from those between the marginal rows R and the edge strips 25R.

The separation lines S are placed between the marginal rows R and the adjacent edge strips 25R. The test units are then in each case the marginal rows R. Within these test units T, the components can be individually electrically measured and tested. Preferably, approximately 20% of the leadframes 2 are in the two test units T.

In other words, a comparatively large proportion of the equipped leadframes 2 can be electrically tested individually by way of merely two separation lines S.

Since the placing of separation lines S is associated with a comparatively high cost expenditure, a high proportion of equipped leadframes 2 can be tested with only a small number of separation lines S in particular in the exemplified embodiment of FIG. 4. Therefore, it is possible to indicate the defect frequency in the equipped leadframe assembly 20 based on statistics.

In contrast to the illustration, it is possible that connecting webs are also located along the marginal rows R between adjacent leadframes 2, as indicated in the non-marginal rows R.

Figure 5:
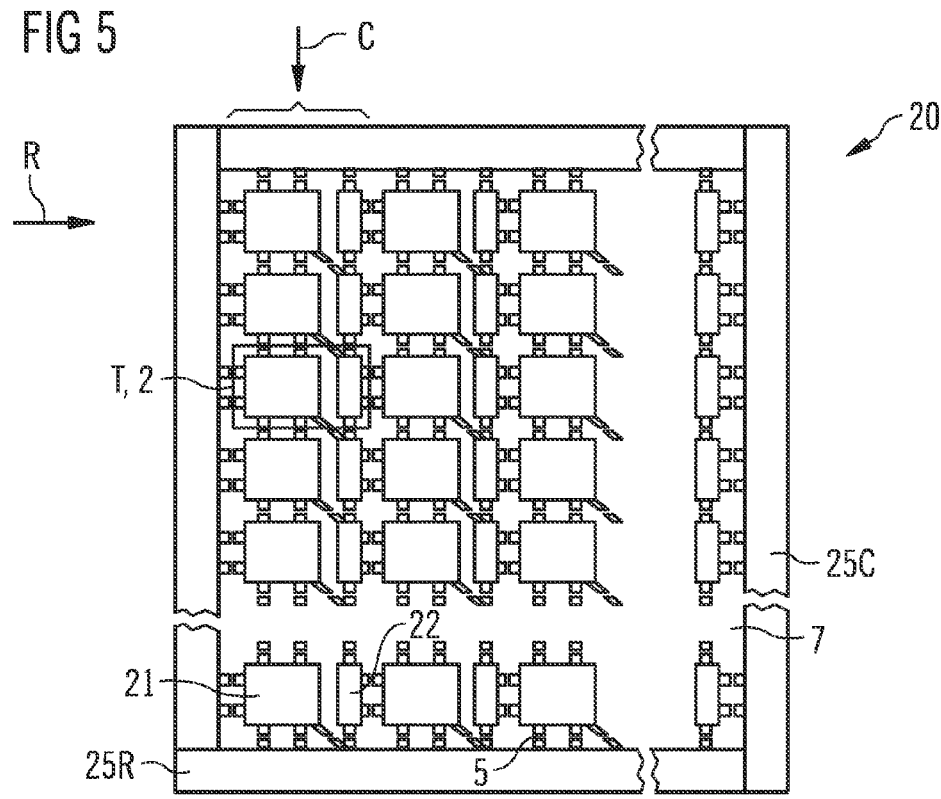

As shown in FIG. 5, the leadframe assembly 20 is mounted on an intermediate carrier 7. Prior to forming the leadframe assembly 20 with the housing material for the housing bodies of the semiconductor components, the leadframe assembly 20 is divided along at least adjacent rows R and/or along adjacent columns C.

FIG. 5 illustrates that the connecting webs 5 are divided between all the columns C and rows R and also between the edge strips 25C, 25R and the adjacent leadframes 2. All the leadframes 2 can be individually electrically measured hereby. Each of the leadframes 2 forms one of the test units T.

In the exemplified embodiment of FIG. 5, it is alternatively also possible to provide the separation lines S, as shown in conjunction with the exemplified embodiments of FIGS. 1 to 4.

FIGS. 6 to 9 illustrate schematic plan views of exemplified embodiments of leadframe assemblies 20. The leadframes 2 each comprise three leadframe parts 21, 22. The individual leadframe assemblies 20 differ in particular in the configuration of the connecting webs 5, in particular along the columns C.

Figure 6:
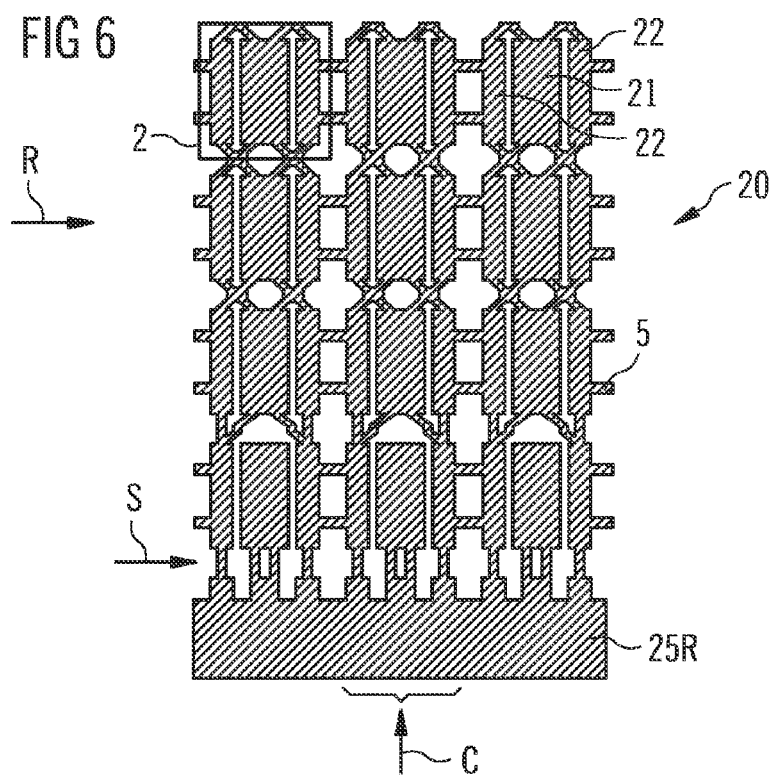

The leadframe assembly 20 of FIG. 6 is particularly configured for a method as explained in conjunction with FIG. 4. The connecting webs 5 on the marginal row R are formed differently from the connecting webs between adjacent other rows R.

An individual leadframe 2 has, as seen in plan view, for example dimensions of approximately 3 mm×3 mm. A distance between adjacent leadframes is, for example, approximately 0.7 mm. A distance between the marginal row R and the edge strip 25R can be approximately 1.2 mm, i.e., larger than the distance between adjacent leadframes 2. Said numerical values are each, for example, met with a tolerance of at the most a factor of 2. Said values are also applicable for all the other exemplified embodiments.

The leadframe assemblies 20 as shown in FIGS. 7 to 9 are, for example, configured for methods as per FIGS. 1 to 3 and 5. In FIG. 7, a part of the connecting webs 5 is formed diagonally along the columns C, wherein a central piece of these connecting webs 5 extends in parallel with the columns C to simplify in particular separation.

As shown in FIG. 8, the connecting webs 5 are formed to be X-shaped along the columns C, as also shown in FIG. 6. By way of these X-shaped connecting webs 5, the leadframe parts 21, 22 are connected to each other indirectly and not directly in the context of the present application within a leadframe 2, since the connecting webs 5 extend not only substantially in parallel with a column C or with a row R, rather substantially have a diagonal progression. The connecting webs 5 comprise, in a central region between adjacent leadframes 2, a partial piece oriented in parallel with the columns C, likewise for simplifying separation to form the finished semiconductor components.

As shown in FIG. 9, the connecting webs 5 are formed similar to a rectangular grid.

FIG. 10 illustrates in a schematic sectional view, see FIG. 10A, and in a schematic bottom view, cf. FIGS. 10B and 10C, an exemplified embodiment of an optoelectronic semiconductor component 1.

The semiconductor component 1 includes at least one semiconductor chip 3, e.g., a light-emitting diode chip, which is mounted on one of the leadframe parts 21 of the leadframe 2 and is connected to the further leadframe part 22 via a bond wire 6. The semiconductor chip 3 is located in a recess 43 of a housing body 4. The recess 43 can optionally be provided with a filling material.

A component lower side 45 is preferably flat. On the component lower side 45, the housing body 4 extends flush with the leadframe parts 21, 22. Alternatively, it is possible that the leadframe parts 21, 22 on the component lower side 45 protrude from the housing body 4.

It can be seen in FIG. 10B that the leadframe part 21 is exposed only at one single lateral boundary surface 42 of the housing body 4. This is caused in particular by producing the semiconductor component 1 with a leadframe as illustrated in conjunction with FIG. 6, and by means of a method as described in FIG. 4.

FIG. 10C illustrates the configuration of the leadframe 2 which is produced by a production method as per FIG. 5. None of the connecting webs 5 extend as far as the lateral boundary surfaces 42. The production method in particular as per FIGS. 4 and 5 is thus apparent on the finished semiconductor component 1.

In contrast to the illustration, it is possible that the connecting webs 5 are not exposed on the component lower side 45 but are covered on the component lower side 45 by a material of the housing body 4. It can thus be the case that only the leadframe parts 21, 22 and not the connecting webs 5 are exposed on the component lower side 45. However, exposure on the lateral boundary surfaces 42 is not influenced hereby. Correspondingly formed leadframe assemblies 20 can also be provided in all the other exemplified embodiments.

The invention described herein is not limited by the description using the exemplified embodiments. Rather, the invention includes any new feature and any combination of features, included in particular in each combination of features in the claims, even if this feature or this combination itself is not explicitly described in the claims or exemplified embodiments.

This patent application claims the priority of German patent application 10 2012 104 882.7, the disclosure content of which is hereby incorporated by reference.

The invention claimed is:

1. A method for producing optoelectronic semiconductor components comprising the steps, in the following sequence, of:
   providing a leadframe assembly with a multiplicity of leadframes arranged in rows and columns,
   wherein each of the leadframes includes at least two leadframe parts which follow one another along the rows and each of the leadframes is provided for one of the optoelectronic semiconductor components,
   wherein the leadframes and leadframe parts are interconnected by connecting webs so that the leadframe assembly is mechanically stabilized by the connecting webs,
   wherein the leadframe assembly comprises at least one marginal row, the marginal row is the row located closest to an edge strip oriented in parallel therewith,
   wherein in this marginal row, first leadframe parts of the marginal row are insulated from first leadframe parts of an adjacent row in the leadframe assembly so that there is no direct electrical connection between these adjacent first leadframe parts by a connecting web and so that there is only an indirect electrical connection via the edge strip,
   wherein the connecting webs between the marginal row and the associated adjacent row are formed differently from the connecting webs between adjacent rows, none of which adjoins the marginal row, and
   wherein the leadframe parts of adjacent rows which are not marginal rows are directly connected with each other along the columns by the connecting webs;
   forming housing bodies of the optoelectronic semiconductor components by forming at least a part of the leadframe assembly with a housing material;
   dividing the leadframe assembly exclusively along and between the marginal row and the associated edge strip, the respective connecting webs being cut through thereby, so that only the leadframes in the marginal row can individually be addressed,
   wherein the leadframes remain arranged in a matrix-like manner;
   equipping each of the leadframes with at least one optoelectronic semiconductor chip on the first leadframe parts;
   testing at least one part of the leadframes equipped with the optoelectronic semiconductor chips and formed with the housing material; and
   separating to form the optoelectronic semiconductor components,
   wherein during the step of testing only one part of the equipped leadframes and the optoelectronic semiconductor chips mounted in the marginal row is tested to render a test result, a statistical evaluation takes place on the basis of the testing of this part of the leadframes and optoelectronic semiconductor chips and the statistical evaluation and the test result are used to make a decision regarding further processing of the leadframe assembly.

2. The method according to claim 1, wherein dividing takes place between precisely two marginal rows and precisely two adjacent edge strips extending in parallel therewith, and
   wherein the two marginal rows include between 10% and 40% of the leadframes inclusive.

3. The method according to claim 1, wherein the step of testing the equipped leadframes and the optoelectronic semiconductor chips is performed along the rows individually.

4. A method for producing optoelectronic semiconductor components comprising the steps, in the following sequence, of:
   providing a leadframe assembly with a multiplicity of leadframes arranged in rows and columns,
   wherein each of the leadframes includes at least two leadframe parts which follow one another along the rows and each of the leadframes is provided for one of the optoelectronic semiconductor components, and
   wherein the leadframes and leadframe parts are interconnected by connecting webs so that the leadframe assembly is mechanically stabilized by the connecting webs;
   forming housing bodies of the optoelectronic semiconductor components by forming at least a part of the leadframe assembly with a housing material;
   dividing the leadframe assembly along and between at least one part of at least the columns or the rows, the respective connecting webs being cut through thereby,
   wherein the leadframes remain arranged in a matrix-like manner;

equipping the leadframes with at least one optoelectronic semiconductor chip;

testing at least one part of the leadframes equipped with the optoelectronic semiconductor chips and formed with the housing material; and separating to form the optoelectronic semiconductor components after the step of forming and after the step of testing, wherein the leadframe assembly includes at least one edge strip which is oriented in parallel with the rows, wherein at least first leadframe parts in a marginal row on the edge strip are insulated from the first leadframe parts of the adjacent row in the leadframe assembly which is not yet divided, wherein the first leadframe parts in the marginal row in the leadframe assembly which is not yet divided are electrically connected only to the edge strip, and wherein during the step of dividing, the leadframe assembly is further continuously divided between the marginal row and the edge strip.

5. The method according to claim 4, wherein during testing only one part of the equipped leadframes and the semiconductor chips mounted thereon is tested, and wherein a test result produced is statistically evaluated and based on this test result a decision is made regarding further processing of the leadframe assembly.

* * * * *